United States Patent [19]
Quinn et al.

[11] Patent Number: 5,422,630
[45] Date of Patent: Jun. 6, 1995

[54] CONTINUOUS MONITORING ELECTROSTATIC DISCHARGE SYSTEM

[75] Inventors: James A. Quinn, Tewksbury, Mass.; George D. Deneault, Nashua, N.H.; Carl H. Bridge, Lawrence; John R. Dempsey, Andover, both of Mass.

[73] Assignee: Raytheon Company, Lexington, Mass.

[21] Appl. No.: 302,072

[22] Filed: Sep. 6, 1994

Related U.S. Application Data

[63] Continuation of Ser. No. 102,125, Aug. 4, 1993, abandoned, which is a continuation of Ser. No. 767,162, Sep. 27, 1991, abandoned.

[51] Int. Cl.$^6$ .................................. G08B 21/00
[52] U.S. Cl. ................................ 340/661; 340/652; 361/212; 324/538; 324/713
[58] Field of Search ............... 340/649, 652, 660, 661, 340/662, 573; 361/212, 220, 42; 324/509, 705, 713, 538

[56] References Cited

U.S. PATENT DOCUMENTS

| | | | |
|---|---|---|---|
| 4,649,374 | 3/1987 | Hoigaard | 340/573 |
| 4,710,751 | 12/1987 | Webster | 340/652 X |
| 4,785,294 | 11/1988 | Campbell | 340/649 |
| 4,800,374 | 1/1989 | Jacobson | 340/649 |
| 5,057,965 | 10/1991 | Wilson | 361/212 |
| 5,083,117 | 1/1992 | Hoigaard | 340/649 |

FOREIGN PATENT DOCUMENTS

0407186A2 1/1991 European Pat. Off. .
3235660A1 3/1984 Germany .

OTHER PUBLICATIONS

"Single chip checks resistance," A. Bande et al., Electronic Engineering, vol. 58, No. 712, Apr. 1986, p. 34, London, Great Britain.

Primary Examiner—Jeffery A. Hofsass
Attorney, Agent, or Firm—Donald F. Mofford

[57] ABSTRACT

A monitoring system is shown to include a connector, having an input path and a current return path, for connecting a two section wrist strap to said connector, said two section wrist strap, when affixed to an operator's wrist, would complete an electrical path between the input path and the current return path of the connector across the wrist skin surface. The monitoring system further includes a current source for providing an electrical current to the input path and a comparator for comparing a voltage at the input path to a high limit value and a low limit value and for providing an alarm signal whenever the voltage at the input path is not between the high limit value and the low limit value. With such an arrangement, an operator is ensured that a proper connection between the operator and ground is maintained thus significantly reducing the possibility of an electrostatic discharge harming an electronic component handled by the operator.

20 Claims, 5 Drawing Sheets

CONTINUOUS MONITORING ELECTROSTATIC DISCHARGE SYSTEM

This application is a continuation of application Ser. No. 08/102,125, filed Aug. 4, 1993, which is a continuation of application Ser. No. 07/767,162, filed Sep. 27, 1991, both abandoned.

BACKGROUND OF THE INVENTION

This invention pertains generally to electrostatic discharge monitoring systems and more particularly to an electrostatic discharge continuous monitoring system adapted to provide a static safe work area.

As it is known, many semiconductor devices as well as other electrical components are easily destroyed or damaged by electrostatic discharges. Typically, the semiconductor devices are subjected to electrostatic discharges when handled during various assembly operations. In a work area wherein semiconductor devices are handled, protective measures are implemented to decrease the likelihood of an electrostatic discharge harming a semiconductor device. For example, ground straps, which are connected to a ground, are connected to electrically conductive wrist bands worn by operators in the work area. Work surfaces, such as a work bench, and floor mats are grounded to an electric ground. As the operator moves about the work area, the ground strap provides a path to ground to dissipate electrostatic charges that are generated by movement of the workers.

Unfortunately, if a ground connection should fail unnoticed and electrostatic charges occur, a semiconductor device sensitive to electrostatic energy can be damaged without the operator (worker) being aware of a problem.

SUMMARY OF THE INVENTION

With the foregoing background of this invention in mind, it is a primary object of this invention to provide a continuous monitoring electrostatic discharge system adapted to provide an alarm when a worker or work station is not properly grounded.

Another object of this invention is to provide a static safe work area.

Still another object of this invention is to provide electrostatic discharge protection during fault or shorted conditions, the result of which may be harmful to a worker or the product.

The foregoing and other objects of this invention are met generally by a monitoring system including a connector, having an input path and a current return path, for connecting a two section wrist strap to said connector, said two section wrist strap, when affixed to an operator's wrist, would complete an electrical path between the input path and the current return path of the connector across the wrist skin surface. The monitoring system further includes a current source for providing an electrical current to the input path and means for connecting a resistor within the current return path to provide a voltage at the input path. The monitoring system also includes a comparator for comparing the voltage at the input path to a high limit value and a low limit value and for providing an alarm signal whenever the predetermined voltage at the input path is not between the high limit value and the low limit value.

With such an arrangement, an operator is ensured that a proper connection between the operator and ground is maintained thus significantly reducing the possibility of an electrostatic discharge harming an electronic component handled by the operator.

A further aspect of the present invention includes the method of ensuring an operator is properly connected to a ground potential for protecting circuit elements from electrostatic discharges between the operator and ground including the steps of coupling a two section strap having an input path and an output path to the operator such that the operator completes a signal path between the input path and the output path of the two section strap. The method further includes providing a predetermined electrical current to the input path of the two section strap and connecting a bleeding resistor between the output path of the two section strap and an electrical current return path for providing a predetermined voltage at the input path of the two section strap. The method also includes comparing continuously the predetermined voltage at the input path of the two section strap to a high limit value and a low limit value and providing an alarm signal whenever the predetermined voltage at the input path of the two section strap is not between the high limit value and the low limit value.

With such a method, the likelihood of a product being damaged from an electrostatic discharge when handled by an operator is substantially eliminated.

BRIEF DESCRIPTION OF THE DRAWINGS

For a more complete understanding of this invention reference is now made to the following description of the accompanying drawings, wherein.

DESCRIPTION OF THE PREFERRED EMBODIMENT

Figure 1:
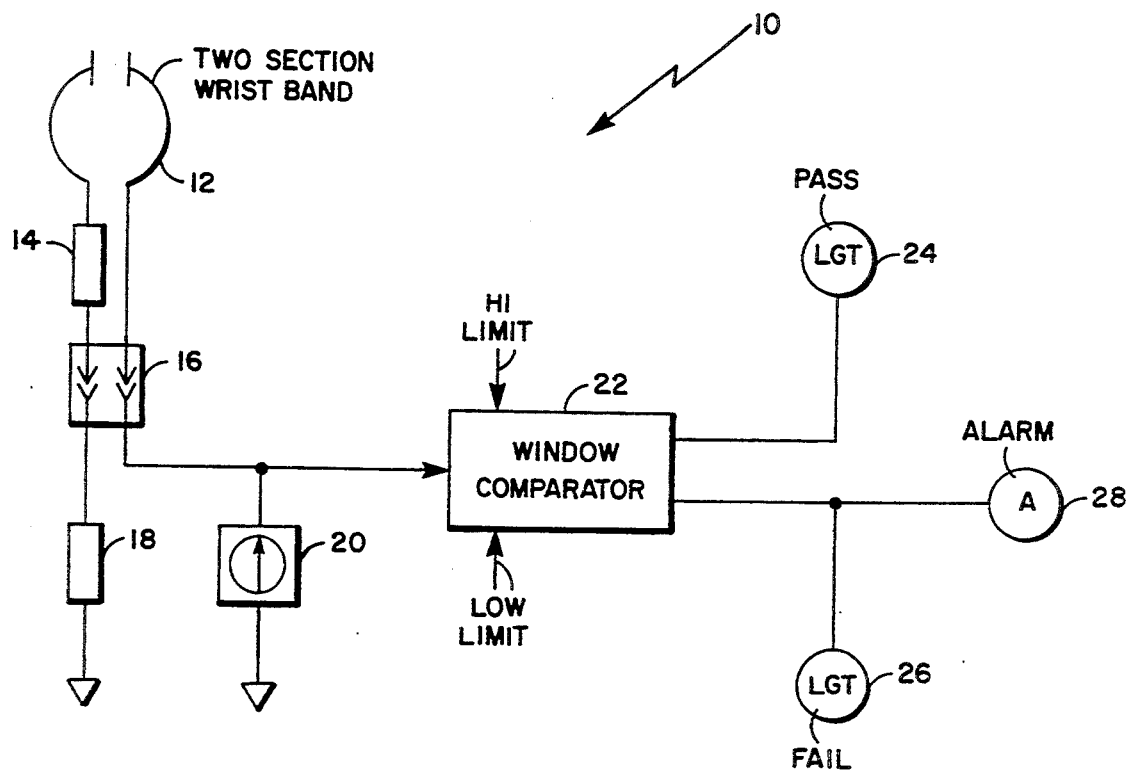
FIG. 1 is a simplified block diagram of a monitoring circuit according to the invention.
Figure 5:
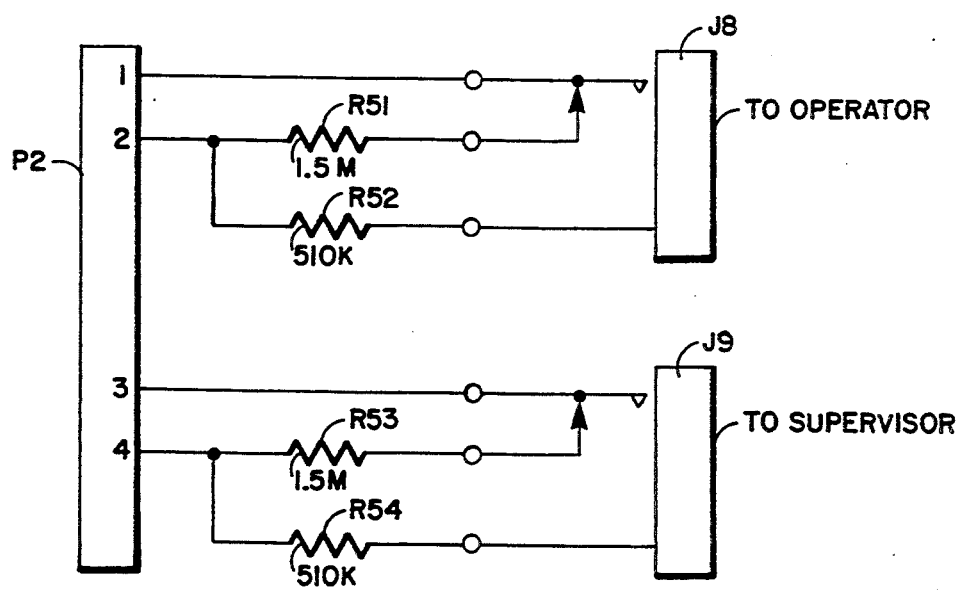
FIGS. 3A, 3B, 4 and 5, when used together, are a schematic diagram of a preferred embodiment of electrical circuitry used to implement the invention.

Referring now to FIG. 1, a block diagram of an electrostatic discharge (ESD) continuous monitoring system element 10 is shown to include a current source 20. The current source 20 provides an electrical current to an input path of a two section wrist band 12 (hereinafter referred to as wrist band 12) via a first terminal of a two terminal connector 16. The wrist band 12 having an input path and an output path is arranged to connect the input path to the output path when worn by a worker. The output path of the wrist band 12 is connected to a second terminal of the two terminal connector 16 through a resistor 14. The connector 16 is then connected to a resistor 18 which then in turn is connected to a current source path return. In the present embodiment, the resistor 14 is a 500K Ω resistor and the resistor 18 is a 500K Ω resistor. The current source 20 is a one microamp current source, thus providing one volt per each one meg ohm resistance in the current path.

The output of the current source 20 is also connected to an input port of a comparator 22. As such, when the wrist band 12 is worn by a worker a current path is provided producing an appropriate voltage at the input of the comparator 22. When the voltage is between an appropriate high limit value and an appropriate low limit value, a light 24 is illuminated to indicate a safe or a pass status. If the voltage at the input of the comparator 22 is not between the high limit value and the low limit value then a light 26 is illuminated indicating a fail status and an alarm 28 is also activated. For example, if the high limit value is set for 1.5 volts and the low limit value is set for one volt, then if the monitored resistance is less than one MΩ or more than 1.5M Ω, the fail light 26 and the alarm 28 are activated. If the monitored resistance is one MΩ or greater, but not more than 1.5M Ω, then the pass light 24 is activated. It should now be appreciated when the wrist band 12 is not making a proper connection with the worker, an alarm is activated indicating the worker is not adequately protected. It should also be appreciated such a technique could also be used with other devices. For example, an appropriate current source could be fed to a solder pot through a bleeding resistor to ensure the solder pot was properly grounded. Additionally, a floor mat, a work surface, or any other device in the work area could be connected appropriately to ensure they are properly grounded.

Figure 2:
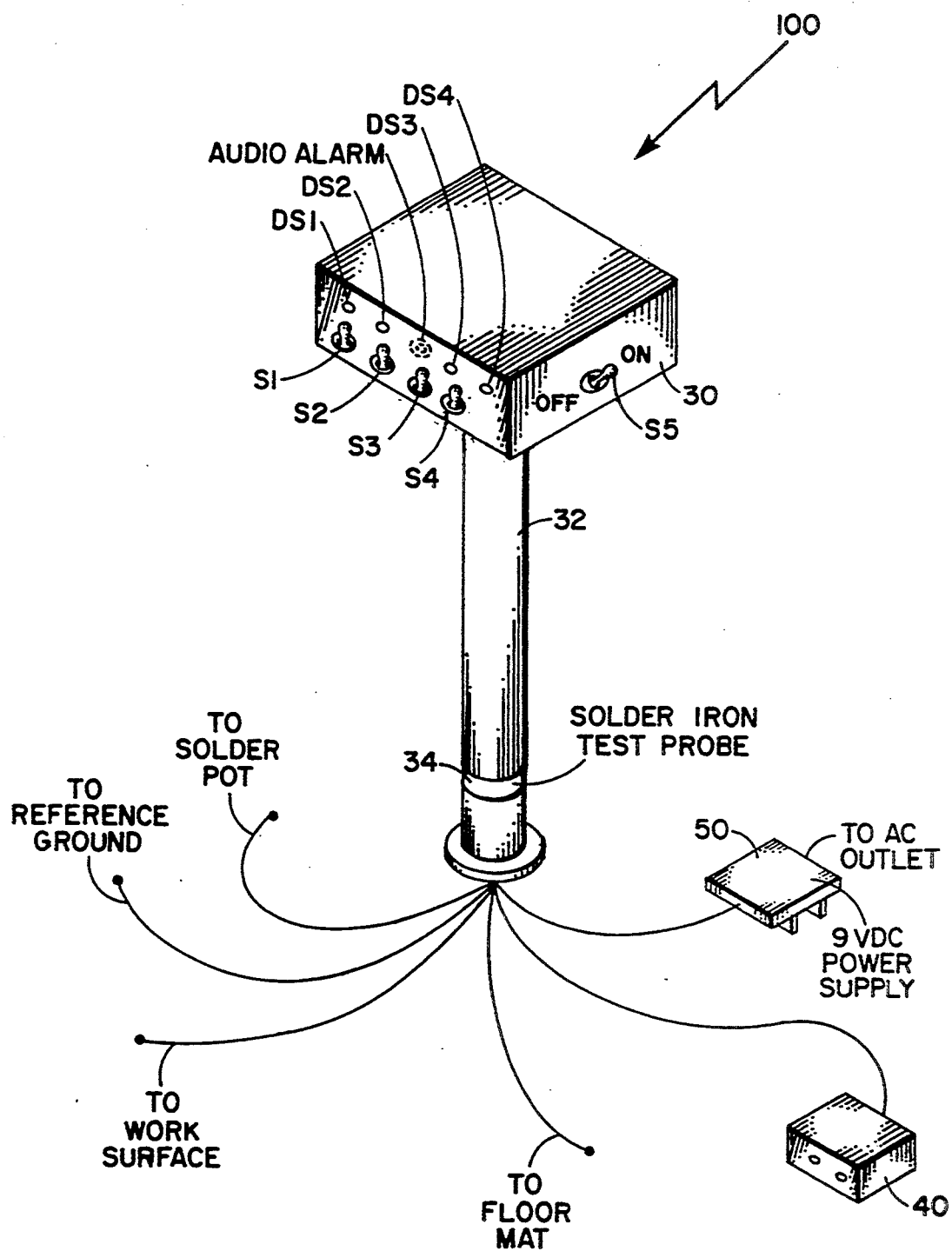
FIG. 2 is a sketch of an implementation of an electrostatic discharge continuous monitoring system according to the invention.

Referring now to FIG. 2, a monitoring system 100 is shown to include a circuit box 30 mounted on a pedestal 32. The circuit box 30 houses electronic circuitry as to be described further hereinafter as well as a plurality of switches, S1, S2, S3, S4 and S5 which allow the worker to perform various tests as well as switching the monitoring system 100 off and on. Additionally, the circuit box 30 includes a plurality of lights DS1, DS2, DS3 and DS4 which indicate various status conditions. Also an audio alarm is provided. Through the base of pedestal 32 various wires extend to make connections to various devices around the work station, for example, to a solder pot, to a work surface, to a floor mat and to a connection box 40 wherein a worker and a supervisor can be connected to the monitoring system 100. Additionally a connection to a reference ground is made as well as a connection to an AC power outlet, via a power supply 50. A test probe 34 is also provided to allow the worker to test a hot solder iron to ensure the solder iron is properly grounded. With such an arrangement, various devices in the work station and the operator are ensured to have a proper connection to ground thus reducing the possibility of an electrostatic discharge harming an electronic component when handled by the worker.

Figure 3A:
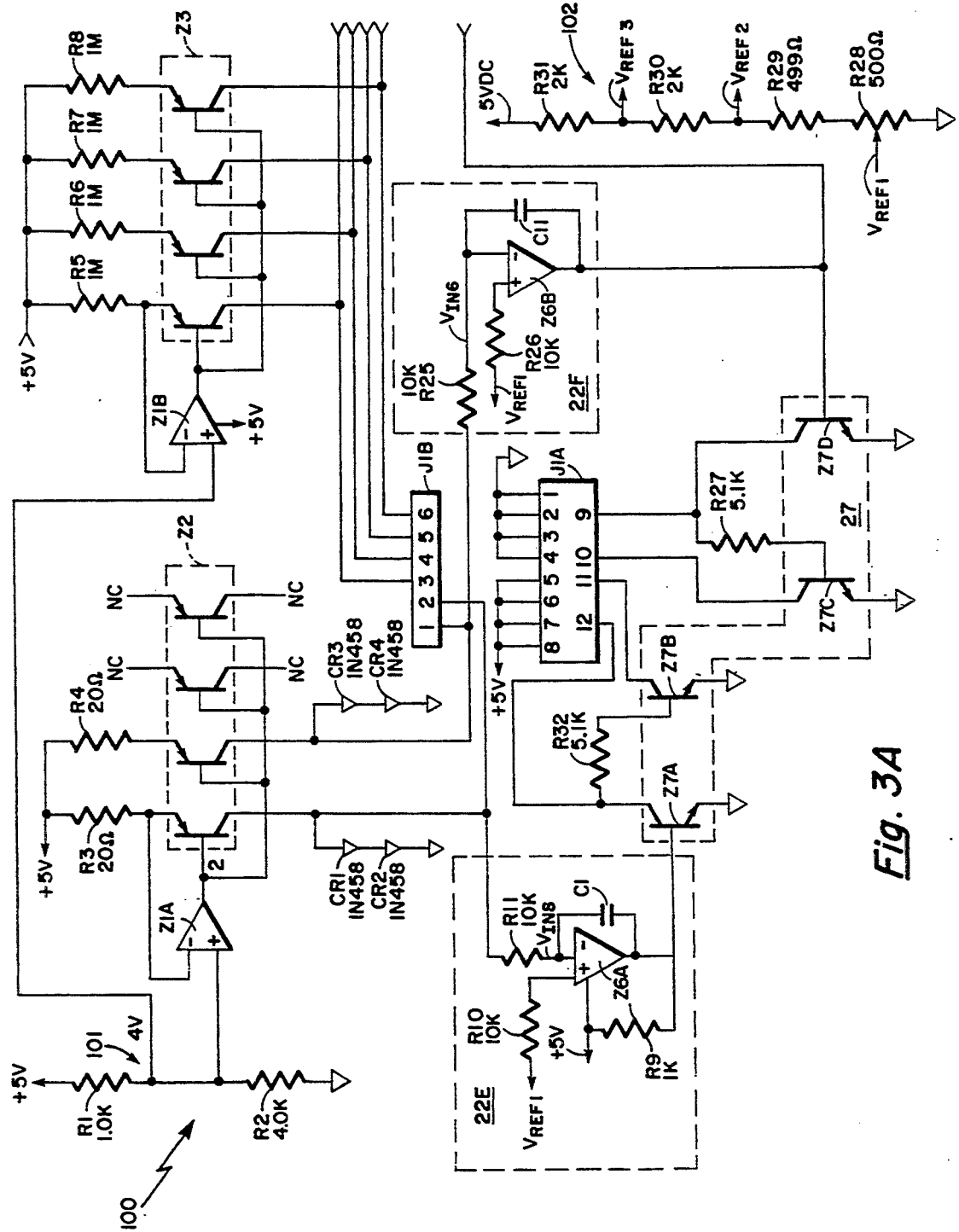
Figure 3B:
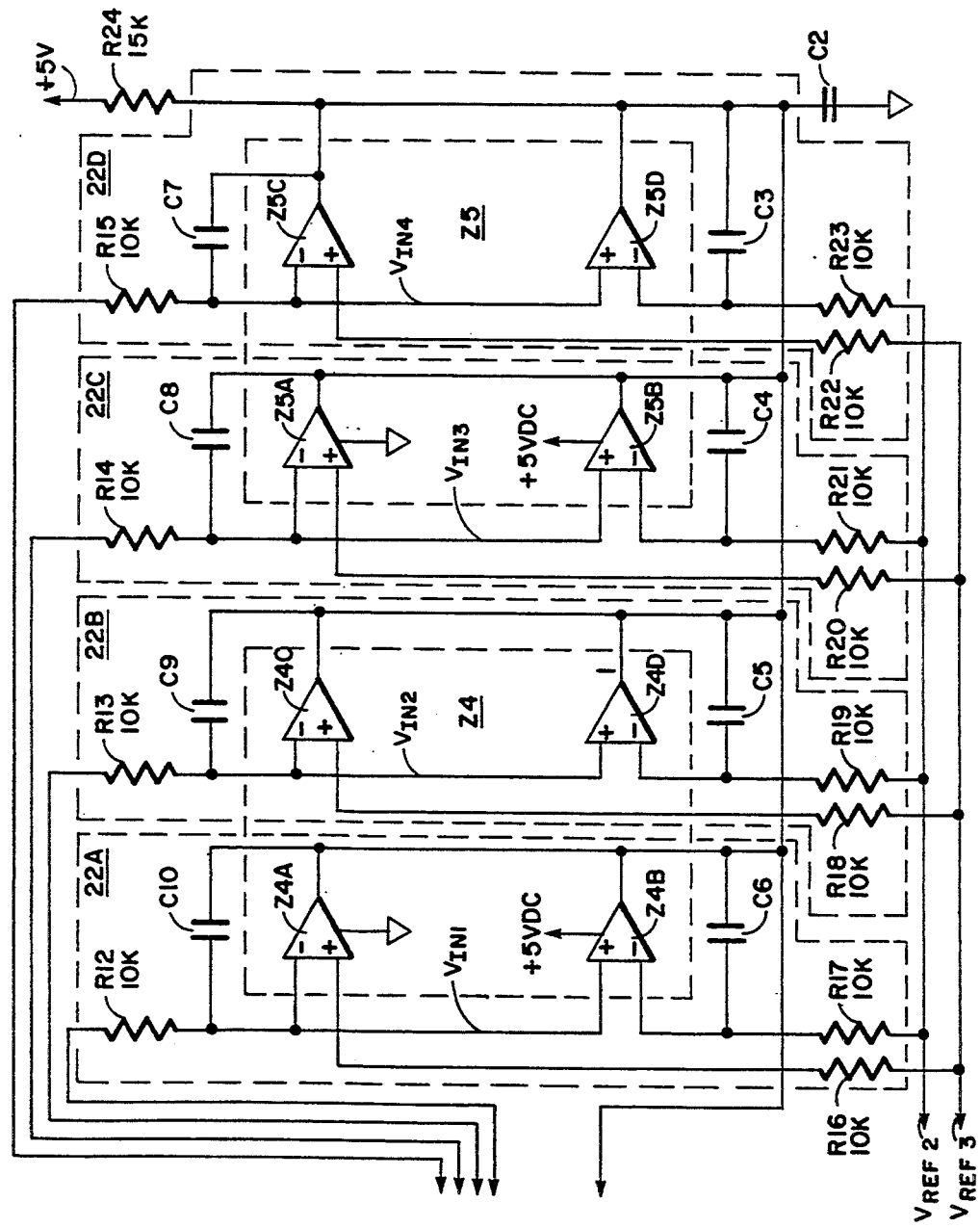
Figure 4:
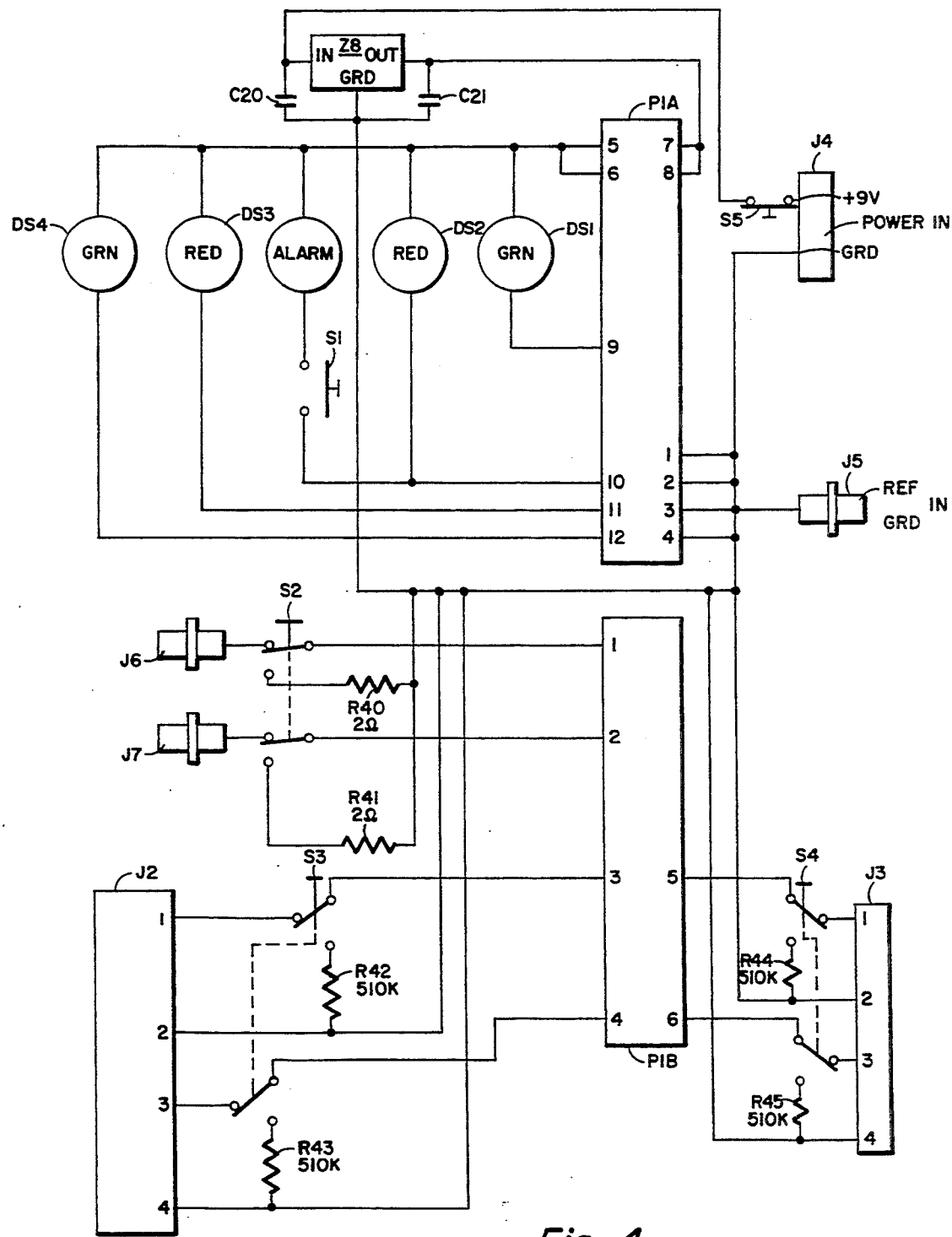

Referring now to FIGS. 3A, 3B, and 4, electronic circuitry (not numbered) required to implement the monitoring system 100 is shown. A nine-volt DC power line is provided, via terminals of a connector J4, from the power supply 50 (FIG. 2), here from a nine-volt DC power supply such as a Switchcraft PC-712A, manufactured by Switchcraft, Inc. located in Chicago, Ill. The switch S5 is provided in line with the nine-volt DC power line to turn the monitoring system 100 on and off. A 0.47 microfarad capacitor C20 is provided between the nine-volt DC power line and ground. The nine-volt DC power line is fed to an input of a five-volt power supply regulator Z8, here provided by a LM78M05CP integrated circuit, wherein the output thereof provides a five-volt DC signal. A 0.47 microfarad capacitor C21 is connected between the output of the five-volt power supply regulator Z8 and ground. The five-volt DC signal is then fed, via connector P1A and J1A, to the various integrated circuits throughout the electronic circuit to provide the required five-volt DC signal.

As described earlier in connection with FIG. 2, the monitoring system 100 provides monitoring capability for a worker, a supervisor, a floor mat, a work surface, a solder pot and a solder iron. As such, the monitoring system 100 requires six current sources, here four one microamp constant current sources and two fifty milliamp constant current sources as to be described.

A voltage divider network 101 is provided by connecting a 1.0K Ω resistor R1 in series with a 4.0K Ω resister R2 between the five-volt DC signal and ground. As such a 4 volt DC signal is provided at a connection between the resistor R1 and resistor R2. To provide the four one microamp constant current sources, the four volt DC signal is fed to a first input of an operational amplifier Z1B, here provided by an LM358AN type integrated circuit which also provides an operational amplifier Z1A. An integrated circuit Z3, here an MPQ2907 type integrated circuit, provides four PNP transistors. The output of the operation amplifier Z1B is fed to the base of each of the PNP transistors. The emitter of each of the transistors are connected to the five-volt DC signal via a one MΩ resistor R5, R6, R7, R8 respectively. The emitter of one of the transistors is also connected to a second input of the operation amplifier Z1B. With such an arrangement, the collector of each of the transistors provide a one microamp constant current source.

To provide the two fifty milliamp constant current sources, the four-volt DC signal is also fed to a first input of the operational amplifier Z1A. An integrated circuit Z2, here also an MPQ2907, provides four PNP transistors of which two of the PNP transistors are not used. The output of the operational amplifier Z1A is fed to the base of the remaining two transistors. Each of the emitters of the transistors are connected to the five-volt power signal through a 20 ohm resistor R3, R4 respectively. Additionally, the emitter of one of the transistors are connected to the second input of the operational amplifier Z1A as shown. The collector of one of the transistors is connected to an anode of diode CR1 having also a cathode. The cathode of diode CR1 is connected to an anode of diode CR2 having also a cathode. The cathode of diode CR2 is connected to ground. Diode CR1 and diode CR2 are here 1N458 type diodes. The collector of the other one of the transistors is connected to the anode of diode CR3 having also has a cathode. The Cathode of diode CR3 is connected to an anode of a diode CR4 having also a cathode. The cathode of diode CR4 is connected to ground. Diode CR3 and diode CR4 are also IN458 type diodes. With such an arrangement, the collector of each of the transistors provide a 50 milliamp constant current source.

Window comparators 22A, 22B, 22C and 22D, associated respectively with each of the one microamp constant current sources each include an input and an output, with the outputs of the window comparators 22A, 22B, 22C and 22D connected together. A 15K Ω resistor R24 is connected between the five-volt DC signal and the outputs of the window comparators 22A, 22B, 22C and 22D. A 0.47 microfarad capacitor C2 is connected between ground and the outputs of the window comparators 22A, 22B, 22C and 22D. The outputs of window comparators 22A, 22B 22C and 22D are also connected to a base connector of an NPN transistor Z7D.

Looking now at window comparator 22A, it can be seen, the output of one of the one microamp constant current sources is connected to the input of the window comparator 22A. The window comparator 22A is adapted to provide an approximately five volt output signal when the voltage of an input signal is between an appropriate high limit value and an appropriate low limit value and to provide a near ground output signal when the voltage of the input signal is not between the appropriate high limit value and the appropriate low limit value. The appropriate high limit value is provided by a high voltage reference signal, $V_{REF3}$ and the appropriate low limit value is provided by a low voltage reference signal $V_{REF2}$.

The high voltage reference signal $V_{REF3}$ and the low voltage reference signal $V_{REF2}$ are provided by a voltage divider network 102. The voltage divider network 102 includes a 500 Ω variable resistor R28, a 499 Ω resistor R29, a 2K Ω resistor R30 and a 2K Ω resistor R31 connected in series between ground and the five-volt DC signal as shown. The high voltage reference signal $V_{REF3}$ is provided at a connection between the resistor R30 and the resistor R31. The low voltage reference signal $V_{REF2}$ is provided at a connection between the resistor R29 and the resistor R30. A variable output of the 500 Ω variable resistor R28 provides a variable voltage reference signal $V_{REF1}$. With such an arrangement, substantially 1.0002 milliamps of current flow through the resistors R28, R29, R30 and R31 such that the high voltage reference signal $V_{REF3}$ provides a 2.9996 volt reference signal level and the low voltage reference signal $V_{REF2}$ provides approximately a 0.999 volt reference signal level. The variable voltage reference signal $V_{REF1}$ has a variable voltage from 0 volts to approximately 0.5001 volts, but is set to approximately 0.11 volts.

The window comparator 22A includes a pair of operational amplifiers Z4A and Z4B, each having a first and second input and an output. The pair of operational amplifiers Z4A and Z4B are provided by an integrated circuit Z4, here a LM339AN type integrated circuit, having four operational amplifiers Z4A, Z4B, Z4C and Z4D disposed within. An input signal $V_{IN1}$ to the window comparator 22A is fed, via a 10K Ω resistor R12, to the first input of the operational amplifier Z4A and also to the second input of the operational amplifier Z4B. The high voltage reference signal $V_{REF3}$ is fed through a 10K Ω resistor R16 to the second input of the operational amplifier Z4A. The low voltage reference signal $V_{REF2}$ is fed through a 10K Ω resistor R17 to the first input of the operational amplifier Z4B. A 0.47 microfarad capacitor C10 is connected between the output and the first input of the operational amplifier Z4A. A 0.47 microfarad capacitor C6 is connected between the output and the first input of the operational amplifier Z4B.

When the input signal $V_{IN1}$ is fed to the comparator 22A, if the voltage of the input signal $V_{IN1}$ is less positive than the voltage of the high voltage reference signal $V_{REF3}$, then the output of the operational amplifier Z4A is approximately five volts. If the voltage of the input signal $V_{IN1}$ is more positive than the voltage of the high voltage reference signal $V_{REF3}$, then the output of the operational amplifier Z4A is near ground. Furthermore, if the voltage of the input signal $V_{IN1}$ is more positive than the voltage of the low voltage reference signal $V_{REF2}$, then the output of the operational amplifier Z4B is approximately five volts. If the voltage of the input signal $V_{IN1}$ is less positive than the voltage of the low voltage reference signal $V_{REF2}$, then the output of the operational amplifier Z4B is near ground. It should now be appreciated, when the voltage of the input signal $V_{IN1}$ is equal to or greater than the voltage of the low voltage reference signal $V_{REF2}$ and is equal to or lower than the voltage of the high voltage reference signal $V_{REF3}$, then the output signal of the window comparator 22A is approximately five volts. When the voltage of the input signal $V_{IN1}$ is less than the voltage of the low voltage reference signal $V_{REF2}$ or greater than the voltage of the high voltage reference signal $V_{REF3}$, then the output signal of the window comparator 22A is near ground.

In a like manner, window comparator 22B includes a pair of operational amplifiers Z4C and Z4D, each having a first and second input and an output. An input signal $V_{IN2}$ to the window comparator 22B is fed, via a 10K Ω resistor R13, to the first input of the operational amplifier Z4C and also to the second input of the operational amplifier Z4D. The high voltage reference signal $V_{REF3}$ is fed through a 10K Ω resistor R18 to the second input of the operational amplifier Z4C. The low voltage reference signal $V_{REF2}$ is fed through a 10K Ω resistor R19 to the first input of the operational amplifier Z4D. A 0.47 microfarad capacitor C9 is connected between the output and the first input of the operational amplifier Z4C. A 0.47 microfarad capacitor C5 is connected between the output and the first input of the operational amplifier Z4D. The window comparator 22B operates in a manner similar to the window comparator 22A such that when the voltage of the input signal $V_{IN2}$ is equal to or greater than the voltage of the low voltage reference signal $V_{REF2}$ and is equal to or lower than the voltage of the high voltage reference signal $V_{REF3}$, then the output signal of the window comparator 22B is near five volts. When the voltage of the input signal $V_{IN2}$ is less than the voltage of the low voltage reference signal $V_{REF2}$ or greater than the voltage of the high voltage reference signal $V_{REF3}$, then the output signal of the comparator 22B is near ground.

Window comparator 22C includes a pair of operational amplifiers Z5A and Z5B, each having a first and second input and an output. Window comparator 22D includes a pair of operational amplifiers Z5C and Z5D, each having a first and second input and an output. The operational amplifiers Z5A, Z5B, Z5C and Z5D are provided by an integrated circuit Z5, here an LM339AN type integrated circuit.

An input signal $V_{IN3}$ to the window comparator 22C is fed, via a 10K Ω resistor R14, to the first input of the operational amplifier Z5A and also to the second input of the operational amplifier Z5B. The high voltage reference signal $V_{REF3}$ is fed through a 10K Ω resistor R20 to the second input of the operational amplifier Z5A. The low voltage reference signal $V_{REF2}$ is fed through a 10K Ω resistor R21 to the first input of the operational amplifier Z5B. A 0.47 microfarad capacitor C8 is connected between the output and the first input of the operational amplifier Z5A. A 0.47 microfarad capacitor C4 is connected between the output of the first input of the operational amplifier Z5B.

An input signal $V_{IN4}$ to the window comparator 22D is fed, via a 10K Ω resistor R15, to the first input of the operational amplifier Z5C and also to the second input of the operational amplifier Z5D. The high voltage reference signal $V_{REF3}$ is fed through a 10K Ω resistor R22 to the second input of the operational amplifier Z5C. The low voltage reference signal $V_{REF2}$ is fed through a 10K Ω resistor R23 to the first input of the operational amplifier Z5D. A 0.47 microfarad capacitor C7 is connected between the output and the first input of the operational amplifier Z5C. A 0.47 microfarad capacitor C3 is connected between the output and the first input of the operational amplifier Z5D. The window comparator 22C and the window comparator 22D operate in a manner similar to the window comparator 22A.

With such an arrangement, if the voltage of any of the input signals $V_{IN1}$, $V_{IN2}$, $V_{IN3}$ and $V_{IN4}$ is greater than the voltage of the high voltage reference signal $V_{REF3}$ or lower than the voltage of the low voltage reference signal $V_{REF2}$, then the voltage at the base connector of the NPN transistor Z7D is driven near ground to turn the NPN transistor Z7D off as described further hereinafter. If the voltage of any of the input signals $V_{IN1}$, $V_{IN3}$, $V_{IN3}$ or $V_{IN4}$ is less than or equal to the voltage of the high voltage reference signal $V_{REF3}$ and greater than or equal to the voltage of the low voltage reference signal $V_{REF2}$, then the voltage at the base connector of the NPN transistor Z7D is approximately five volts to turn the NPN transistor Z7D on as described further hereinafter.

Comparators 22E and 22F are associated with the two fifty milliamp constant current sources. An integrated circuit, here a LM339AN type integrated circuit, provides four operational amplifiers including operational amplifiers Z6A and Z6B, each having a first and second input and an output. The other two operational amplifiers are not used. The comparator 22E includes the operational amplifier Z6A with a 0.47 microfarad capacitor C1 connected between the output and the first input of the operational amplifier Z6A. An input signal $V_{IN5}$ to the comparator 22E is fed, via a 10K Ω resistor R11, to the first input of the operational amplifier Z6A. The variable voltage reference signal $V_{REF1}$ is fed through a 10K Ω resistor R10 to the second input of the operational amplifier Z6A. The output of the operational amplifier Z6A is fed to a base connector of an NPN transistor Z7A. The comparator 22F includes the operational amplifier Z6B with a 0.47 microfarad capacitor C11 connected between the output and the first input of the operational amplifier Z6B. An input signal $V_{IN6}$ to the comparator 22F is fed, via a 10K Ω resistor R25, to the first input of the operational amplifier Z6A. The variable voltage reference signal $V_{REF1}$ is fed through a 10K Ω resistor R26 to the second input of the operational amplifier Z6B. The output of the operational amplifier Z6B is fed to the base connector of the NPN transistor Z7D.

Comparators 22E and 22F are adapted to provide an approximately five volt output signal when the voltage of the respective input signal $V_{IN5}$, $V_{IN6}$ is less than or equal to the voltage of the variable voltage reference signal $V_{REF1}$. The comparators 22E and 22F are adapted to provide a near ground output signals when the voltage of the respective input signal $V_{IN5}$, $V_{IN6}$ is greater than the voltage of the variable voltage reference signal $V_{REF1}$.

As described hereinabove, the outputs of the window comparators 22A, 22B, 22C and 22D and the output of the comparator 22F are connected to the base connector of the NPN transistor Z7D. An integrated circuit Z7, here an MPQ2222 type integrated circuit, provides four NPN transistors Z7A, Z7B, Z7C and Z7D, each having an emitter, a collector and a base connector. The NPN transistor Z7D is arranged such that the emitter connection is connected to ground and the collector connection is connected to a first terminal of a light DS1, via a terminal of the connectors J1A and P1A. The light DS1, having the first terminal and a second terminal, is a green light when illuminated. The second terminal of the light DS1 is connected to the five-volt DC signal. With such an arrangement, if an approximately five volt potential is fed to the base connector of the NPN transistor Z7D, the NPN transistors Z7D will conduct, completing a current path to ground for the light DS1, illuminating the light DS1. If a near ground potential is fed to the base connector of the NPN transistor Z7D, the NPN transistor Z7D will not conduct, breaking the current path to ground for the light DS1 so that the light DS1 is not illuminated.

The NPN transistor Z7C is arranged such that the emitter connection is connected to ground and a 5.1K Ω resistor R27 is connected between the base connection of the NPN transistor Z7C and the collector connection of the NPN transistor Z7D. The collector connection of the NPN transistor Z7C is connected to a first terminal of a light DS2, via a terminal of the connectors J1A and P1A. The light DS2, having the first terminal and a second terminal, is a red light when illuminated. The second terminal of the light DS2 is connected to the five-volt DC signal. The first terminal of the light DS2 is also connected to an input of a switch S1 having also an output. The output of the switch S1 is connected to a first terminal of an audible alarm (not numbered) having also a second terminal. The second terminal of the audible alarm is connected to the five-volt DC signal. When the switch S1 is open, the audible alarm is not activated and when the switch S1 is closed, the audible alarm is activated when the light DS2 is illuminated. With such an arrangement, if an approximately five volt potential is fed to the base connector of the NPN transistor Z7C, the NPN transistor Z7C will conduct, completing a current path to ground for the light DS2, illuminating the light DS2. If a near ground potential is fed to the base connector of the NPN transistor Z7C, the NPN transistor Z7C will not conduct, breaking the current path to ground for the light DS2 so that the light DS2 is not illuminated. As arranged, when the NPN transistor Z7D is conducting, a near ground potential is fed to the base connection of the NPN transistor Z7C so that the NPN transistor Z7C is not conducting. When the NPN transistor Z7D is not conducting, an approximately five volt potential is fed to the base connection of the NPN transistor Z7C so that the NPN transistor Z7C is conducting.

It should now be apparent, if an approximately five volt potential is fed to the base connection of the NPN transistor Z7D, then the light DS1 is illuminated and the light DS2 is not illuminated. If a near ground potential is fed to the base connection of the NPN transistor Z7D, then the light DS1 is not illuminated and the light DS2 is illuminated and when the switch S1 is closed, the audible alarm is activated.

The monitoring system 100 also includes the NPN transistor Z7A and the NPN transistor Z7B arranged in a manner similar to the NPN transistor Z7C and the NPN transistor Z7D. The emitter connection of the NPN transistor Z7A is connected to ground and the emitter connection of the NPN transistor Z7B is connected to ground. A 5.1K Ω resistor R32 is connected between the collector connection of the NPN transistor Z7A and the base connection of the NPN transistor Z7B. A 1K Ω resistor R9 is connected between the base connection of the NPN transistor Z7A and the five-volt DC signal. The collector connection of the NPN transistor Z7A is also connected, via a terminal of the connectors J1A and P1A, to a first terminal of a light DS4 having also a second terminal. The light DS4 is a green light when illuminated. The second terminal of the light DS4 is connected to the five-volt DC signal. The collector connection of the NPN transistor Z7B is connected, via a terminal of the connectors J1A and P1A, to a first terminal of a light DS3 having also a second terminal. The light DS3 is a red light when illuminated. The second terminal of the light DS3 is connected to the five-volt DC signal. When the NPN transistor 7A is not conducting, an approximately five volt potential is fed to the base connection of the NPN transistor Z7B. If an approximately five volt potential is fed to the base connection of the NPN transistor Z7B, the NPN transistor Z7B will conduct, completing a current path to ground for the light DS3 so that the light DS3 is illuminated. If a near ground potential is fed to the base connector of the NPN transistor Z7B, the NPN transistor Z7B will not conduct, breaking the current path to ground for the light DS3 so that the light DS3 is not illuminated.

With such an arrangement, if an approximately five volt potential is fed to the base connection of the NPN transistor Z7A, then the NPN transistor Z7A will conduct completing a current path to ground for the light DS4 so that the light DS4 is illuminated. If a near ground potential is fed to the base connector of the NPN transistor Z7A, the NPN transistor Z7A will not conduct breaking the current path to ground for the light DS4 so that the light DS4 is not illuminated. When the NPN transistor Z7A is conducting, a near ground potential is fed to the base connection of the NPN transistor Z7B.

It should now be apparent, if an approximately five volt potential is fed to the base connection of the NPN transistor Z7A, then the light DS4 is illuminated and the light DS3 is not illuminated. If a near ground potential is fed to the base connection of the NPN transistor Z7A, then the light DS4 is not illuminated and the light DS3 is illuminated.

As described hereinabove, the output of each of the fifty milliamp current sources is connected to an input of a corresponding one of the comparators 22E and 22F. The output of one of the fifty milliamp current sources is also connected, via a terminal of the connectors J1B and P1B, to an input of a first pole of a two pole double throw switch S2. The switch S2 having a first pole and a second pole with each pole having an input and a first and second output, is arranged such that the first pole is in a normally closed position between the input and the first output and the second pole is in a normally closed position between the input and the first output. The first output of the first pole of switch S2 is connected to a connector J6, which is used to connect a solder pot (not shown) to the monitoring system 100. With such an arrangement, the voltage of the input signal $V_{IN6}$ is controlled by the amount of resistance between the connector J6 and ground. If the connector J6 is connected to a properly grounded solder pot, then the amount of resistance between the connector J6 and ground is minimal and the voltage of the input signal $V_{IN6}$ is minimal. If the connector J6 is connected to an improperly connected solder pot, then the voltage of the input signal $V_{IN6}$ varies in accordance with the amount of resistance between the connector J6 and ground. Since the fifty milliamp current source provides fifty milliamps of current, if the amount of resistance between the connector J6 and ground is less than 2.2 ohms, then the voltage of the input signal $V_{IN6}$ is less than the voltage of the variable reference signal $V_{REF1}$ and the output of the comparator 22F is an approximately five volt potential. If the amount of resistance between the connector J6 and ground is more than 2.2 ohms, then the voltage of the input signal $V_{IN6}$ is greater than the voltage of the variable reference signal $V_{REF1}$ and the output of the comparator 22F is near ground.

It should now be apparent, if the resistance between the connector J6 and ground is less than 2.2 ohms, then the light DS1 is illuminated and the light DS2 is not illuminated. If the resistance between the connector J6 and ground is greater than 2.2 ohms, then the light DS1 is not illuminated and the light DS2 is illuminated and when the switch S1 is closed, the audible alarm is activated, warning the worker of an improper condition.

The output of the other one of the fifty milliamp current sources is also connected, via a terminal of the connectors J1B and P1B, to the input of the second pole of switch S2. The first output of the second pole of switch S2 is connected to a connector J7. The connector J7 is used to connect the solder iron test probe 34 (FIG. 2) to the monitoring system 100. With such an arrangement, the voltage of the input signal $V_{IN5}$ is controlled by the amount of resistance between the connector J7 and ground. When a worker places a properly grounded solder iron in contact with the solder iron test probe 34 (FIG. 2), then the amount of resistance between the connector J7 and ground will be minimal and the voltage of the input signal $V_{IN5}$ is minimal. When a worker places an improperly grounded solder iron in contact with the solder iron test probe. 34 (FIG. 2) or when the solder iron is not in contact with the solder iron test probe 34 (FIG. 2), then the amount of resistance between the connector J7 and ground in large and the voltage of the input signal $V_{IN5}$ is large. Since the fifty milliamp current source provides fifty milliamps of current, if the amount of resistance between the connector J7 and ground is less than 2.2 ohms, then the voltage of the input signal $V_{IN5}$ is less than the voltage of the variable reference signal $V_{REF1}$ and the output of the comparator 22E is an approximately five volt potential. If the amount of resistance between the connector J7 and ground is more than 2.2 ohms, then the voltage of the input signal $V_{IN5}$ is greater than the voltage of the variable reference signal $V_{REF1}$ and the output of the comparator 22E is near ground.

It should now be apparent, if the resistance between the connector J7 and ground is less than 2.2 ohms, then the light DS4 is illuminated and the light DS3 is not illuminated indicating a properly grounded solder iron to the worker. If the resistance between the connector J7 and ground is greater than 2.2 ohms, then the light DS4 is not illuminated and the light DS3 is illuminated warning the worker of an improper condition.

The switch S2 is provided to allow the worker to test the above described conditions. A 2 Ω resistor R40 is connected between the second output of the first pole of the switch S2 and ground. A 2 Ω resistor R41 is connected between the second output of the second pole of the switch S2 and ground. When the switch S2 is thrown, the first pole of switch S2 is closed between the input and the second output of the first pole and the second pole of switch S2 is closed between the input and the second output of the second pole. With the first pole of switch S2 closed between the input and the second output, the current path to ground through the 2 Ω R40 is completed so that light DS1 is illuminated and light DS2 is not illuminated. With the second pole of switch S2 closed between the input and the second output of the second pole, a current path to ground through the 2 Ω R41 is completed so that light DS4 is illuminated and light DS3 is not illuminated. By activating switch S2, the worker is ensured the lights DS1, DS2, DS3 and DS4 are operating correctly with the above-described circuitry.

As described hereinabove, the output of each one of the one microamp current sources is connected to an input of a corresponding one of the window comparators 22A, 22B, 22C and 22D. The output of one of the one microamp current sources is connected, via a terminal of the connectors J1B and P1B, to an input of a first pole of a switch S3. The switch S3 is a double pole, double throw switch having a first and second pole with each pole having an input and a first and second output. The switch S3 is arranged so that the first and second pole is normally in a closed position between the input and the first output of each pole. The first output of the first pole of switch S3 is connected via corresponding terminals of a connector J2 and a connector P2 to a jack J8, disposed on connection box 40 (FIG. 2), which is used to connect a worker or operator (not shown) to the monitoring system 100. The jack J8 having a first, a second and a third connector is adapted so that the first connector is connected to the second connector when a plug (not shown) is not mated with the jack J8, and when a plug (not shown) is mated with a jack J8, the connection between the first connector and the second connector is broken. The plug (not shown) having a first and a second connector is adapted, when mated with the jack J8, so that the first connector of the plug is connected to the first connector of the jack J8 and the second connector of the plug is connected to the third connector of the jack J8. The second connector of the jack J8 is connected to a 1.5M Ω resistor R51 which is connected in series to ground via corresponding terminals of the connectors P2 and J2. The third connector of the jack J8 is connected to a 510K Ω resistor R52 which is connected in series to ground via the connectors P2 and J2. The second output of the first pole of switch S3 is connected to a 510K Ω resistor R42 which is connected in series to ground. With such an arrangement, when a plug (not shown) is not connected to the jack J8, the 1.5M Ω resistor R51 is in the signal path between the one microamp current source and ground providing a corresponding voltage for the input signal $V_{IN1}$ to the window comparator 22A. When a plug is mated with the jack J8 then the resistance provided between the first connector and the third connector of the jack J8 and the 510K Ω resistor R52 is in the signal path between the output of the one microamp current source and ground providing an corresponding voltage for the input signal $V_{IN1}$ to the input of the window comparator 22A. Here, the first connector and the second connector of the plug, which is mated with the jack J8, is connected to a 500K Ω resistor in series with a two-section wrist strap which is attached to the worker.

The output of a second one of the one microamp current sources is connected, via a terminal of the connectors J1B and P1B, to the input of the second pole of the switch S3. The first output of the second pole of the switch S3 is connected, via corresponding terminals of the connector J2 and the connector P2, to a first connection of a jack J9 disposed on connection box 40 (FIG. 2) which is used to connect a supervisor or a second worker (not shown) to the monitoring system 100. The jack J9 having the first, a second and a third connector is similar to the jack J8 and is adapted so that the first connector is connected to the second connector when a plug (not shown) is not mated with a jack J9 and when a plug (not shown) is mated with the jack J9 the connection between the first connector and the second connector is broken. The second connection of the jack J9 is connected to a 1.5M Ω resistor R53 which is connected in series, via the connectors P2 and J2, to ground. The third connection of the jack J9 is connected to a 510K Ω resistor R54 which is connected in series to ground. Using a plug having a first and a second connection connected in series with a 500K Ω resistor and a two-section wrist strap, the supervisor can be connected to the monitoring system 100.

With such an arrangement, if the monitored resistance is less than one MΩ or more than 3M Ω, the light DS2 is illuminated indicating an improper condition. With the 510K Ω resistor R52 in the current path provided by the monitoring system 100 and the 500K Ω resistor in the current path provided by the wrist strap, shock protection to the worker in the event of a wrist strap failure is provided. When the wrist strap is properly attached to the worker, the total resistance in the current path through the wrist strap 25 is less than 3M Ω but if hair, dry skin or any other fault prevents a proper connection of the wrist strap, the resistance will exceed 3M Ω and the light DS2 is illuminated. Similarly, a supervisor is provided shock protection in the event of a wrist strap failure with the above-described circuit for the supervisor which operates similar to the circuit described for the worker.

The switch S3 is provided to allow the worker to test the wrist band circuitry. When the switch S3 is not thrown, the first pole and second pole of the switch S3 are disposed with the input of each pole connected to the respective first output.

If the jack J8 and the jack J9 is not mated with a corresponding plug, then there is 1.5M Ω of resistance in each current path between a respective one-microamp current source and ground. The latter is a proper condition so that the light DS1 is illuminated. When the switch S3 is thrown, each input is connected to the respective second output of each pole. With the latter, the 510K Ω resistor R42 and the 510K Ω resistor R43 are in each respective current path between the respective one-microamp current source and ground so that the light DS2 is illuminated and the light DS1 is not illuminated. By activating switch S3, the worker is ensured that the lights DS1 and lights DS2 are operating correctly with the above-described circuitry.

The output of a third one of the one microamp current sources is connected, via a terminal of the connectors J1B and P1B, to an input of a first pole of a switch S4. The switch S4 is a double pole, double throw switch having a first and a second pole with each pole having an input and a first and a second output. The switch S4 is arranged such that the first pole and the second pole are normally in a closed position between the input and the first output, respectively. The first output of the first pole of switch S4 is connected, via a terminal of a connector J3, to a work surface (not shown). The work surface is connected via another terminal of the connector J3 to ground. The second output of the first pole of switch S4 is connected to a 510K Ω resistor which is connected in series to ground. With such an arrangement, the work surface is connected to the monitoring system 100.

The output of the fourth one of the one microamp current sources is connected, via a terminal of the connectors J1B and P1B, to the input of the second pole of the switch S4. The first output of the second pole of the switch S4 is connected, via a terminal of the connector J3, to a floor mat (not shown). The floor mat is also connected, via another terminal of the connector J3, to ground. The second output of the second pole of the switch S3 is connected to a 510K Ω resistor R45 which is connected in series to ground. With such an arrangement, the floor mat is connected to the monitoring system 100.

The work surface and the floor mat are connected to the monitoring system 100 such that each provides between 1.0M Ω and 3M Ω resistance in the respective current path between a corresponding one-microamp current source and ground. The switch S4 is provided to allow the worker to test the corresponding circuitry. When the switch S4 is not thrown, the work surface and the floor mat are disposed in the respective current paths and the light DS1 is illuminated. When the switch S4 is thrown, the 510K Ω resistor R44 and the 510K Ω resistor R45 are disposed in the respective current paths and the light DS2 is illuminated. Thus by activating switch S4, the worker is ensured the lights DS1 and DS2 are operating correctly with the above-described circuitry.

It should now be apparent, the monitoring system 100 is adapted to provide an alarm when a worker is not properly grounded or when various devices in the work station are not properly grounded thus reducing the possibility of an electrostatic discharge harming an electronic component. Furthermore, in the open circuit condition, the voltage provided to the operator is below that which is harmful.

Having described this invention, it will now be apparent to one of skill in the art that various elements of the invention may be changed without affecting this invention. For example, a pair of lights (a green light and a red light) and the associated activation circuitry as disclosed could be used with each window comparator instead of connecting the output of all the window comparators together and using a single pair of lights. Also the number of current sources and comparators can be increased as the need necessitates, for example, if more devices require protection in the work station. It is felt, therefore, that this invention should not be restricted to its disclosed embodiment but rather should be limited only by the spirit and scope of the appended claims.

What is claimed is:

1. A monitoring system comprising:
   (a) means, having an input path and a current return path, for connecting a device to said connecting means;
   (b) means for providing a nonintermittent, constant and nonvarying magnitude, electrical current to the input path; and
   (c) means for continuously comparing a voltage at the input path to a high limit value and a low limit value and for providing an alarm signal whenever the voltage at the input path is not between the high limit value and the low limit value indicating an electrostatic discharge.

2. The monitoring system as recited in claim 1 wherein the device is a two section wrist strap having a current return path and a resistor disposed in the current return path.

3. The monitoring system as recited in claim 1 wherein the continuously comparing means comprises:
   (a) voltage source having a voltage with the high limit value;
   (b) a voltage source having a voltage with the low limit value; and
   (c) a pair of operational amplifiers, each one of the operational amplifiers having a first and a second input and an output, the first input of a first one of the pair of operational amplifiers connected to the input path of the connecting means and the second input of a second one of the pair of operational amplifiers connected to the input path of the connecting means, the second input of the first one of the pair of operational amplifiers connected to the voltage source having the high limit value and the first input of the second one of the pair of operational amplifiers connected to the voltage source having the low limit value.

4. The monitoring system as recited in claim 1 further comprising:
   (a) second means, having an input path and a current return path, for connecting a second two section wrist strap to said second connecting means;
   (b) second means for providing a nonintermittent, constant and nonvarying magnitude, electrical current to the input path of the second connecting means and for connecting a resistor disposed in the current return path of the second connecting means; and
   (c) second means for comparing a voltage at the input path of the second connecting means to the high limit value and the low limit value and for providing an alarm signal whenever the voltage at the input path of the second connecting means is not between the high limit value and the low limit value.

5. The monitoring system as recited in claim 4 further comprising:
   (a) third means, having an input path for connecting a work surface to said third connecting means;
   (b) third means for providing a nonintermittent, constant and nonvarying magnitude, electrical current to the input path of the third connecting means; and
   (c) third means for comparing a voltage at the input path of the third connecting means to the high limit value and the low limit value and for providing an alarm signal whenever the voltage at the input path of the third connecting means is not between the high limit value and the low limit value.

6. The monitoring system as recited in claim 5 further comprising:
   (a) fourth means, having an input path for connecting a floor mat to said fourth connecting means;
   (b) fourth means for providing a nonintermittent, constant and nonvarying magnitude, electrical current to the input path of the fourth connecting means; and
   (c) fourth means for comparing a voltage at the input path of the fourth means to the high limit value and the low limit value and for providing an alarm signal whenever the voltage at the input path of the fourth connecting means is not between the high limit value and the low limit value.

7. The monitoring system as recited in claim 6 further comprising:
   (a) fifth means, having an input path for connecting a solder pot to said fifth connecting means;
   (b) fifth means for providing a nonintermittent, constant and nonvarying magnitude, electrical current to the input path of the fifth connecting means; and
   (c) fifth means for comparing a voltage at the input path of the fifth connecting means to a second high limit value and for providing an alarm signal whenever the voltage at the input path of the fifth connecting means is greater than the second high limit value.

8. The monitoring system as recited in claim 7 further comprising:
   (a) sixth means, having an input path for connecting a solder iron to said sixth connecting means;
   (b) sixth means for providing a nonintermittent, constant and nonvarying magnitude, electrical current to the input path of the sixth connecting means; and
   (c) sixth means for comparing a voltage at the input path of the sixth connecting means to the second high limit value and for providing an alarm signal whenever the voltage at the input path of the sixth connecting means is greater than the second high limit value.

9. A monitoring system comprising:
   (a) a current source having an output terminal and a ground terminal, the ground terminal of the current source connected to an electrical ground, the current source adapted to provide a nonintermittent, predetermined constant and nonvarying magnitude of current;
   (b) a resistor having a first terminal and a second terminal, the second terminal of the resistor connected to the electrical ground;
   (c) a connector disposed between the output terminal of the current source and the first terminal of the resistor; and (d) a comparator having an input connected to the output terminal of the current source to provide an alarm signal when a voltage at the output terminal of the current source varies beyond a predetermined limit indicating on electrostatic discharge.

10. The monitoring system as recited in claim 9 further comprising a two-section wrist strap having a signal input terminal and a signal output terminal and connected to the connector with the signal input terminal coupled to the output terminal of the current source and the signal output terminal connected to the first terminal of the resistor.

11. The monitoring system as recited in claim 9 further comprising:
   (a) a second current source having an output terminal and a ground terminal, the ground terminal of the second current source connected to an electrical ground, the second current source adapted to provide a predetermined nonintermittent, constant and nonvarying magnitude of current;
   (b) a second resistor having a first terminal and a second terminal, the second terminal of the second resistor connected to the electrical ground;
   (c) a second connector disposed between the output terminal of the second current source and the first terminal of the second resistor; and
   (d) a second comparator having an input connected to the output terminal of the second current source to provide an alarm signal when a voltage at the output terminal of the second current source varies beyond a predetermined limit.

12. The monitoring system as recited in claim 11 further comprising:
   (a) a third current source having an output terminal and a ground terminal, the ground terminal of the third current source connected to an electrical ground, the third current source adapted to provide a nonintermittent, predetermined constant and nonvarying magnitude of current;
   (b) a third connector disposed between the output terminal of the third current source and the ground terminal, the third connector adapted to connect to a work surface; and
   (c) a third comparator having an input connected to the output terminal of the third current source to provide an alarm signal when a voltage at the output terminal of the third current source varies beyond a predetermined limit.

13. The monitoring system as recited in claim 12 further comprising:
   (a) a fourth current source having an output terminal and a ground terminal, the ground terminal of the fourth current source connected to an electrical ground, the fourth current source adapted to provide a nonintermittent, predetermined constant and nonvarying magnitude of current;
   (b) a fourth connector disposed between the output terminal of the fourth current source and the ground terminal, the fourth connector adapted to connect to a floor mat; and
   (c) a fourth comparator having an input connected to the output terminal of the fourth current source to provide an alarm signal when a voltage at the output terminal of the fourth current source varies beyond a predetermined limit.

14. The monitoring system as recited in claim 13 further comprising:
   (a) a fifth current source having an output terminal and a ground terminal, the ground terminal of the fifth current source connected to an electrical ground, the fifth current source adapted to provide a nonintermittent, predetermined constant and nonvarying magnitude of current;
   (b) a fifth connector disposed between the output terminal of the fifth current source and the ground terminal, the fifth connector adapted to connect to a solder pot; and
   (c) a fifth comparator having an input connected to the output terminal of the fifth current source to provide an alarm signal when a voltage at the output terminal of the fifth current source varies above a predetermined limit.

15. The monitoring system as recited in claim 14 further comprising:
   (a) a sixth current source having an output terminal and a ground terminal, the ground terminal of the sixth current source connected to an electrical ground, the sixth current source adapted to provide a nonintermittent, predetermined constant and nonvarying magnitude of current;
   (b) a sixth connector disposed between the output terminal of the sixth current source and the ground terminal, the sixth connector adapted to connect to a solder iron test probe; and
   (c) a sixth comparator having an input connected to the output terminal of the sixth current source to provide an alarm signal when a voltage at the output terminal of the sixth current source varies above a predetermined limit.

16. A method of protecting circuit elements from electrostatic discharges from an operator comprising the steps of:
   (a) coupling a two section wrist strap having an input path and an output path to an operator such that the operator completes a signal path between the input path and the output path of the two section strap;
   (b) providing a predetermined nonintermittent, constant and nonvarying magnitude, electrical current to the input path of the two section strap and connecting a bleeding resistor between the output path of the two section strap and an electrical current return path;
   (c) comparing continuously a voltage at the input path of the two section strap to a high limit value and a low limit value; and
   (d) providing an alarm signal whenever the voltage at the input path of the two section strap is not between the high limit value and the low limit value.

17. The method as recited in claim 16 further comprising the steps of:
   (a) coupling a device to a ground terminal;
   (b) providing at an input path to the device a predetermined nonintermittent, constant and nonvarying magnitude, electrical current;
   (c) comparing continuously a voltage at the input path of the device to the high limit value and the low limit value; and
   (d) providing an alarm signal whenever the voltage at the input path of the device is not between the high limit value and the low limit value.

18. The method as recited in claim 17 further comprising the steps of:
   (a) coupling a floor mat to a ground terminal;
   (b) providing at an input path to the floor mat a predetermined nonintermittent, constant and nonvarying magnitude, electrical current;
   (c) comparing continuously a voltage at the input path of the floor mat to the high limit value and the low limit value; and
   (d) providing an alarm signal whenever the voltage at the input path of the floor mat is not between the high limit value and the low limit value.

19. The method as recited in claim 18 further comprising the steps of:
   (a) coupling a solder pot to a ground terminal;
   (b) providing at an input path to the solder pot a predetermined nonintermittent, constant and nonvarying magnitude, electrical current;
   (c) comparing continuously a voltage at the input path of the solder pot to a second different high limit value; and
   (d) providing an alarm signal whenever the voltage at the input path of the solder pot is above the second different high limit value.

20. A method as recited in claim 19 further comprising the steps of:
   (a) coupling a solder iron to a solder iron test probe;
   (b) providing at an input path to the solder iron test probe a predetermined nonintermittent, constant and nonvarying magnitude, electrical current;
   (c) comparing continuously a voltage at the input path of the solder iron test probe to the second different high limit value; and
   (d) providing an alarm signal whenever the voltage at the input path of the solder iron test probe is above the second different high limit value.

* * * * *